United States Patent
Jung et al.

(10) Patent No.: US 7,965,565 B2
(45) Date of Patent: Jun. 21, 2011

(54) CURRENT CANCELLATION FOR NON-VOLATILE MEMORY

(75) Inventors: Chulmin Jung, Eden Prairie, MN (US); Insik Jin, Eagan, MN (US); YoungPil Kim, Eden Prairie, MN (US); Yong Lu, Edina, MN (US); Harry Hongyue Liu, Maple Grove, MN (US); Andrew John Carter, Minneapolis, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 123 days.

(21) Appl. No.: 12/502,208

(22) Filed: Jul. 13, 2009

(65) Prior Publication Data

US 2011/0007581 A1   Jan. 13, 2011

(51) Int. Cl.
  *G11C 7/00*   (2006.01)
(52) U.S. Cl. ........... 365/189.15; 365/230.06; 365/210.1; 365/203; 365/189.09
(58) Field of Classification Search ............. 365/189.15, 365/230.06, 210.1, 203, 189.09
See application file for complete search history.

(56) References Cited

U.S. PATENT DOCUMENTS

| | | | |
|---|---|---|---|
| 6,570,440 B1 | 5/2003 | Chow et al. | |
| 6,952,375 B2 | 10/2005 | Dahl | |
| 7,057,969 B2 | 6/2006 | Chow et al. | |
| 2010/0085797 A1* | 4/2010 | Li et al. ......................... | 365/148 |

OTHER PUBLICATIONS

S. T Hsu, W. W. Zhuang, T. K. Li, W. Pan, A. Ignatiev, C. Papagianni, and N. J. Wu, "RRAM Switching Mechanism," Technology Symposium, Nov. 2005, pp. 121-124, IEEE.

* cited by examiner

*Primary Examiner* — Thong Q Le
(74) *Attorney, Agent, or Firm* — Fellers, Snider et al.

(57) ABSTRACT

A method and apparatus for reading data from a non-volatile memory cell. In some embodiments, a cross-point array of non-volatile memory cells is arranged into rows and columns that are each controlled by a line driver. A read circuit is provided that is capable of reading a logical state of a predetermined memory cell by differentiating a non-integrated first reference value from a non-integrated second reference value. Further, each reference value is measured immediately after configuring the column corresponding to the predetermined memory cell to produce a first and second amount of current.

20 Claims, 7 Drawing Sheets

CURRENT CANCELLATION FOR NON-VOLATILE MEMORY

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency and reliability, particularly by improving the sensing of a memory cell by canceling unwanted current.

SUMMARY

Various embodiments of the present invention are directed to a method and apparatus for reading data from a non-volatile memory cell.

In some embodiments, a cross-point array of non-volatile memory cells is arranged into rows and columns that are each controlled by a line driver. A read circuit is provided that is capable of reading a logical state of a predetermined memory cell by differentiating a non-integrated first reference value from a non-integrated second reference value. Each reference value is measured immediately after configuring the column corresponding to the predetermined memory cell to produce a first and second amount of current.

In other embodiments, a cross-point array of non-volatile memory cells is provided that is arranged into rows and columns that are each controlled by a line driver. A read circuit reads a logical state of a predetermined memory cell by differentiating a non-integrated first reference value from a non-integrated second reference value. Each reference value is measured immediately after configuring the column corresponding to the predetermined memory cell to produce a first and second amount of current.

These and various other features and advantages which characterize the various embodiments of the present invention can be understood in view of the following detailed discussion and the accompanying drawings.

DETAILED DESCRIPTION

Figure 1:
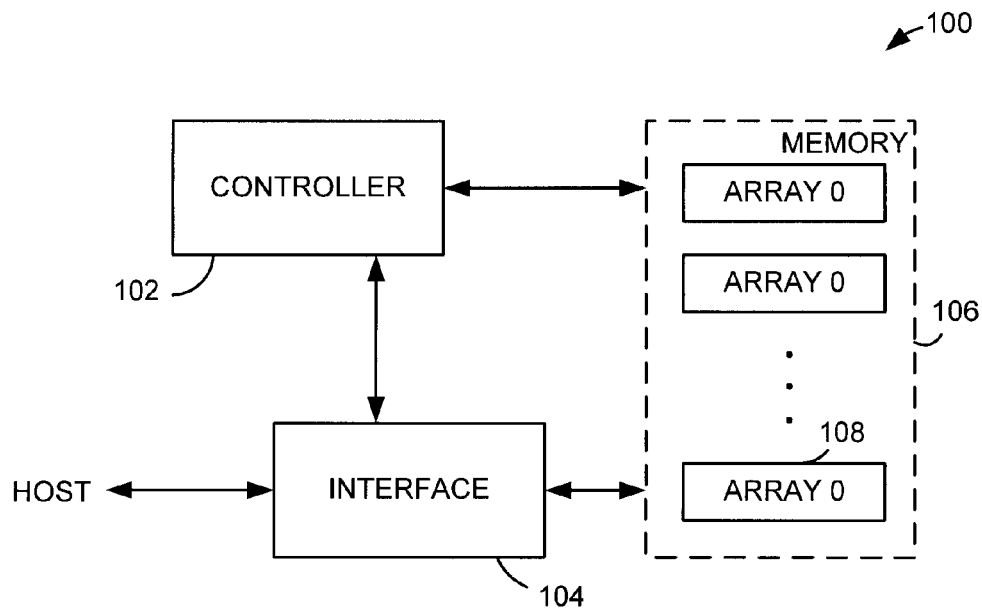
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. Top level control of the device 100 is carried out by a suitable controller 102, which may be a programmable or hardware based microcontroller. The controller 102 communicates with a host device via a controller interface (I/F) circuit 104. A memory space is shown at 106 to comprise a number of memory arrays 108 (denoted Array 0-N), although it will be appreciated that a single array can be utilized as desired. Each array 108 comprises a block of semiconductor memory of selected storage capacity. Communications between the controller 102 and the memory space 106 are coordinated via the I/F 104.

Figure 2:
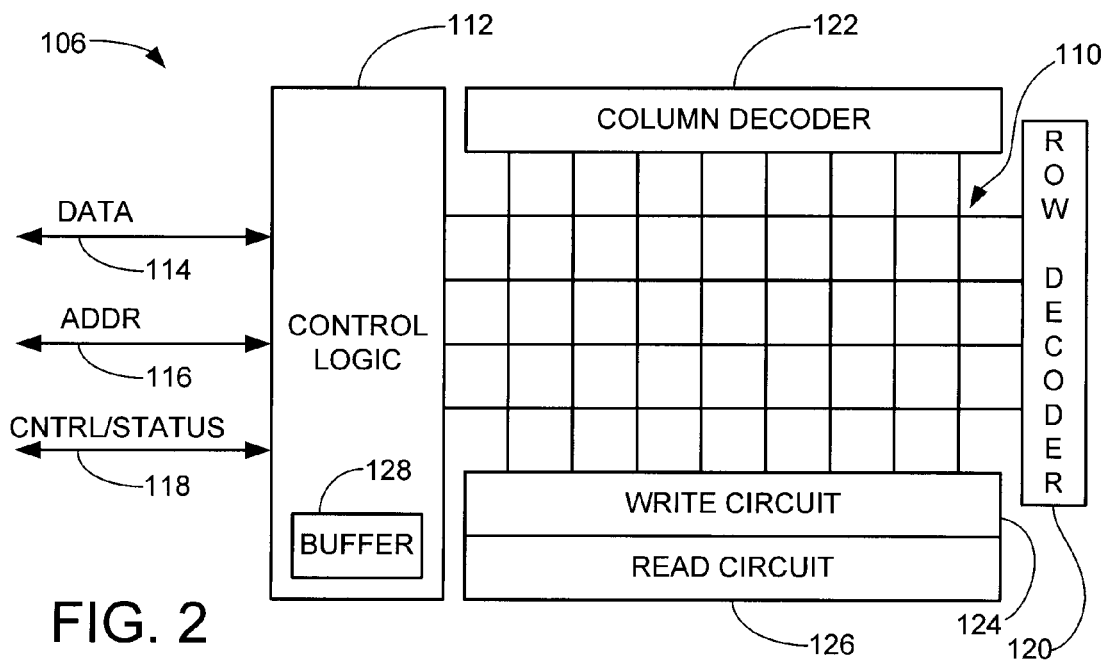
FIG. 2 shows circuitry used to read data from and write data to a memory array of the device of FIG. 1.

FIG. 2 provides a generalized representation of selected aspects of the memory space 106 of FIG. 1. Data can be stored as an arrangement of rows and columns of memory cells 110, accessible by various row (word) and column (bit) lines, etc. In some embodiments, each of the array memory cells 110 has magnetic random access memory (MRAM) configuration, such as a spin-torque transfer random access memory (STTRAM or STRAM) configuration. While in other embodiments, the each array of memory cells 110 has solid state drive configuration, such as a combination of resistive random access memory (RRAM) and flash memory.

The actual configurations of the cells and the access lines thereto will depend on the requirements of a given application. Generally, however, it will be appreciated that the various control lines will generally include enable lines that selectively enable and disable the respective writing and reading of the value(s) of the individual cells.

Control logic 112 receives and transfers data, addressing information and control/status values along multi-line bus paths 114, 116 and 118, respectively. Row and column decoding circuitry 120, 122 provide appropriate switching and other functions to access the appropriate cells 110. A write circuit 124 represents circuitry elements that operate to carry out write operations to write data to the cells 110, and a read circuit 126 correspondingly operates to obtain readback data from the cells 110. Local buffering of transferred data and other values can be provided via one or more local registers 128. At this point it will be appreciated that the circuitry of FIG. 2 is merely exemplary in nature, and any number of alternative configurations can readily be employed as desired depending on the requirements of a given application.

Figure 3:
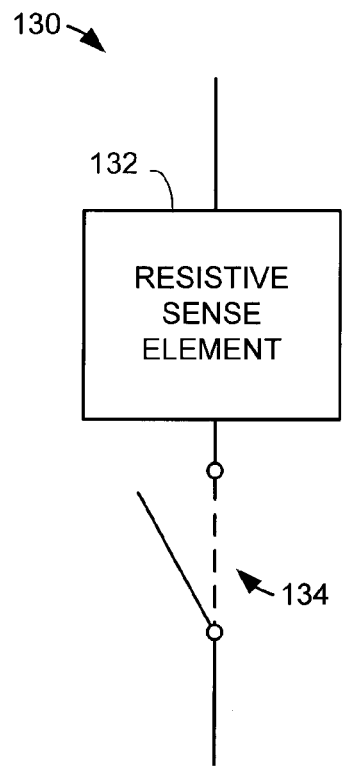
FIG. 3 displays an exemplary memory cell capable of being used in the memory array of FIG. 2.

FIG. 3 displays functional block representations of a memory cell 130, such as the memory cell 110 of FIG. 2, constructed and operated in accordance with various embodiments of the present invention. The memory cell 130 has a resistive sense element (RSE) 132 connected in series with a switching device 134. The switching device 134 functions to drastically increase the resistance of the memory cell 130 when in an open position, as shown, that effectively prevents current from passing. In contrast, a closed position allows the switching device 134 to receive current and pass it through the unit cell 1. A closed switching device 134 also allows current to pass through the RSE 132 in multiple directions.

Advantages of RSE cells over other types of non-volatile memory cells such as EEPROM and flash include the fact that no floating gate is provided in the cell construction. Additionally, no erase operation is necessary prior to the writing of new data to an existing set of cells. Rather, RSE cells can be individually accessed and written to any desired logical state (e.g., a "0" or "1") irrespective of the existing state of the RSE cell. Also, write and read power consumption requirements are substantially reduced, significantly faster write and read times can be achieved, and substantially no wear degradation is observed as compared to erasable cells, which have a limited write/erase cycle life.

Figure 4:
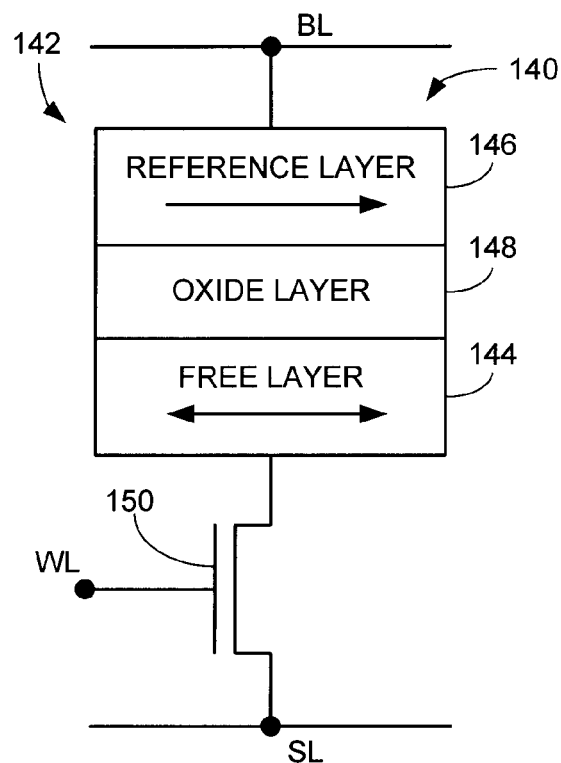
FIG. 4 shows an exemplary resistive sense element capable of being used in the memory cell of FIG. 3.

FIG. 4 shows an exemplary resistive sense element 140 capable of being utilized in the memory cell of FIG. 3. The RSE 140 is configured as a spin torque-transfer random access memory (STRAM) cell that includes a magnetic tunneling junction (MTJ) 142 formed from two ferromagnetic layers 144, 146 separated by an oxide barrier layer 148 (such as magnesium oxide, MgO). The resistance of the MTJ 142 is determined in relation to the relative magnetization directions of the ferromagnetic layers 144, 146: when the magnetization is in the same direction (parallel), the MTJ is in the low resistance state ($R_L$); when the magnetization is in opposite directions (anti-parallel), the MTJ is in the high resistance state ($R_H$).

In some embodiments, the magnetization direction of the reference layer 146 is fixed by coupling the reference layer to a pinned magnetization layer (e.g., a permanent magnet, etc.). The magnetization direction of the free layer 144 can be changed by passing a driving current polarized by magnetization in the reference layer 146.

To read the logic state stored by the MTJ 142, a relatively small current is passed through the MTJ between a source line (SL) and a bit line (BL). Because of the difference between the low and high resistances of the MTJ in the respective logical 0 and 1 states, the voltage at the bit line will be different, which can be sensed using a suitable sense amplifier. A switching device 160 allows selective access to the MTJ 142 during read and write operations. In some embodiments, the switching device 134 is characterized as a PMOS field effect transistor (FET). A word line (WL) is connected to a gate terminal of the FET 134, as shown.

Figure 5:
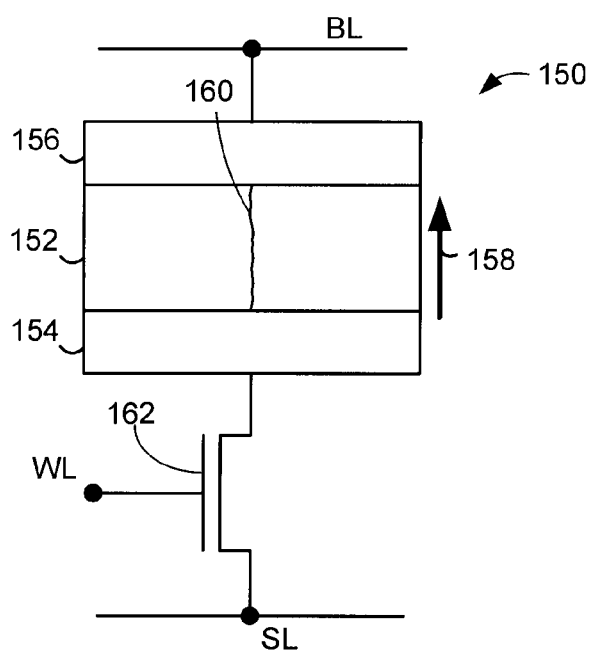
FIG. 5 illustrates an exemplary resistive sense element capable of being used in the memory cell of FIG. 3.

Additionally, another exemplary resistive sense element 150 capable of being utilized in the memory cell of FIG. 3 is displayed in FIG. 5. As shown, the RSE 150 is configured as a resistive random access memory (RRAM) cell that includes a resistive storage layer 152 that is disposed between a first electrode layer 154 and a second electrode layer 156. The RSE 150 has a naturally high resistive value due to the composition and properties of the storage layer 152, which can be an oxide (such as magnesium oxide, MgO) with normally high electrical resistance.

However, a low resistive value is created when a predetermined pulse 158 is applied to the RSE 150 so that an amount of current passes through the storage layer 152 and one or more filaments 160 are formed therein. The formed filament 160 functions to electrically interconnect the first electrode layer 154 and the second electrode layer 156. The filament formation process will generally depend on the respective compositions of the layers, but generally, a filament such as 160 can be formed through the controlled metal migration (e.g., Ag, etc.) from a selected electrode layer into the oxide storage layer.

The subsequent application of a voltage pulse of increased current across the RSE 150 will generally drive the metal from the storage layer 152 back into the associated electrode layers 154 or 156, removing the filament 160 from the storage layer 152 and returning the RSE to the initial high resistance state. Such application of voltage can be facilitated, in some embodiments, by the selection of a switching device 134.

Figure 6:
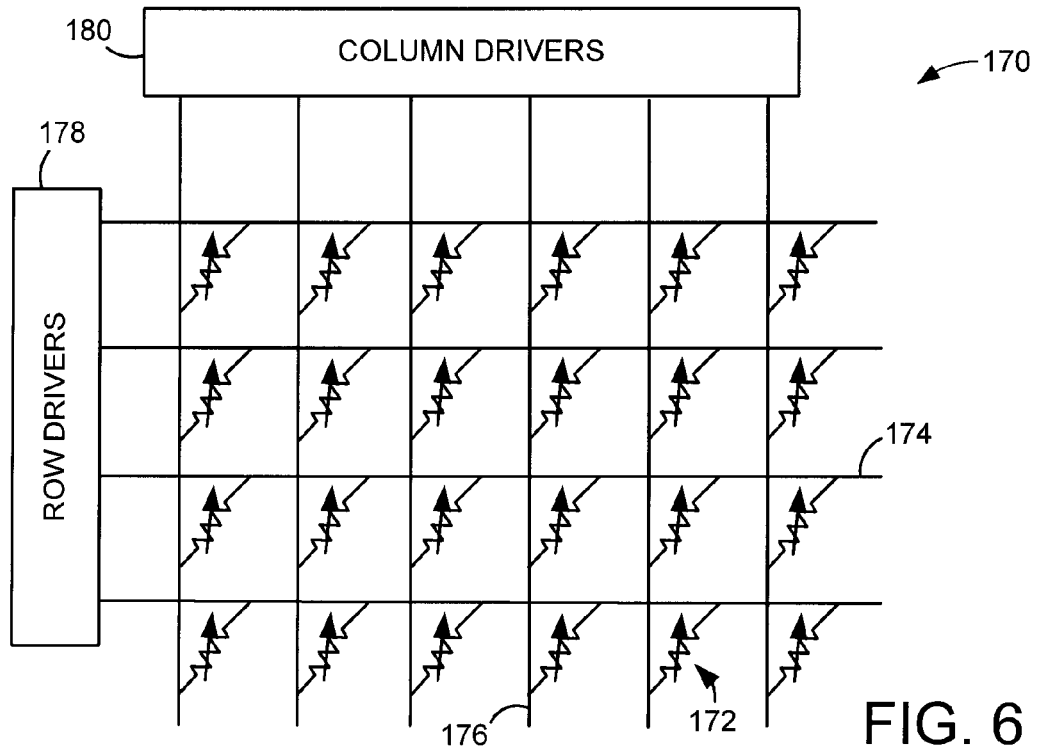
FIG. 6 displays an exemplary cross-point array of memory cells constructed and operated in accordance with various embodiments of the present invention.

In FIG. 6, an exemplary cross-point array of memory cells 170 is shown as constructed in accordance with various embodiments of the present invention. A plurality of memory cells 172, such as the exemplary RSE 140 and 150 of FIGS. 4 and 5, are connected to bit lines 174 that, in some embodiments, connect a number of memory cells 172 along a row. Similarly, a word line 176 can be configured to connect a plurality of memory cells 172 along a column.

However, it should be noted that the orientation of bit lines 174 and word lines 176 shown in FIG. 6 is purely exemplary and in no way limiting to the possible configurations of the cross-point array of memory cells 170. For example, a bit line 174 can connect memory cells along a column while a word line 176 connects memory cells along a row.

In an exemplary operation of the cross-point array of memory cells 170, a read current could pass through a predetermined memory cell 172 from the bit line 174 to the word line 176. It can be appreciated that the opposite current flow from word line 176, through a predetermined memory cell 172, to bit line 174 is possible depending on the desired direction of current flow through the predetermined memory cell 172.

Further in some embodiments, a row driver 178 either alone or in combination with a column driver 180 can configure the bit and word lines 174 and 176 to direct current through a selected one, or many, memory cells 172 at a time. As a current flows through a selected memory cell 172, a resulting voltage will indicate a corresponding resistive state. Such resistive state can then be sensed to determine a logical state for the selected memory cell 172.

Figure 7:
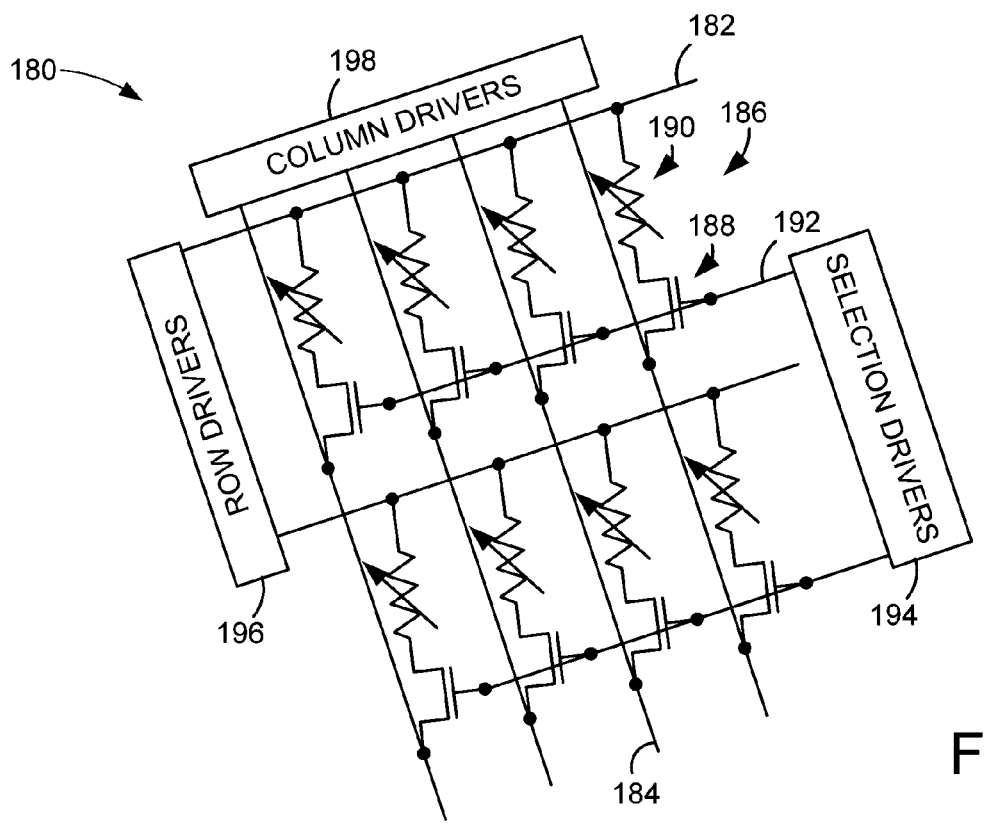
FIG. 7 illustrates an exemplary cross-point array of memory cells constructed and operated in accordance with various embodiments of the present invention.

Another possible configuration of a cross-point array of memory cells 180 is illustrated in FIG. 7. While a plurality of bit lines 182 and word lines 184 connect rows and columns of memory cells 186 in a manner similar to FIG. 6, the configuration of the memory cells 186 can be modified to include a switching device 188 in combination with an RSE 190, such as the memory cell 130 shown in FIG. 3.

In operation, the switching device 188 of each memory cell 186 can be connected and controlled by a control line 192. As such, the control line 192 can be configured to provide a signal to activate the switching device 188 and allow current to flow through a selected memory cell 186 by a selection driver 194. However, in various embodiments the switching device 188 can be connected to the bit line 182 to effectively eliminate the need for a selection driver 194. Regardless, the incorporation of a switching device 188 can provide additional selection capabilities for a cross-point array of memory cells 180 that can allow increased precision for data access.

However, it should be noted that the number and orientation of the memory cells 186 are not limited to the configurations shown in FIGS. 6 and 7 and can be configured in various manners. Similarly, the presence of line drivers is not restricted. That is, a global set of line drivers can provide control of a single word or bit line 182 or 184 as easily as a set of row drivers 196 and column drivers 198 connected to each word and bit line 182 and 184 of a cross-point array of memory cells 180, as shown.

Figure 8:
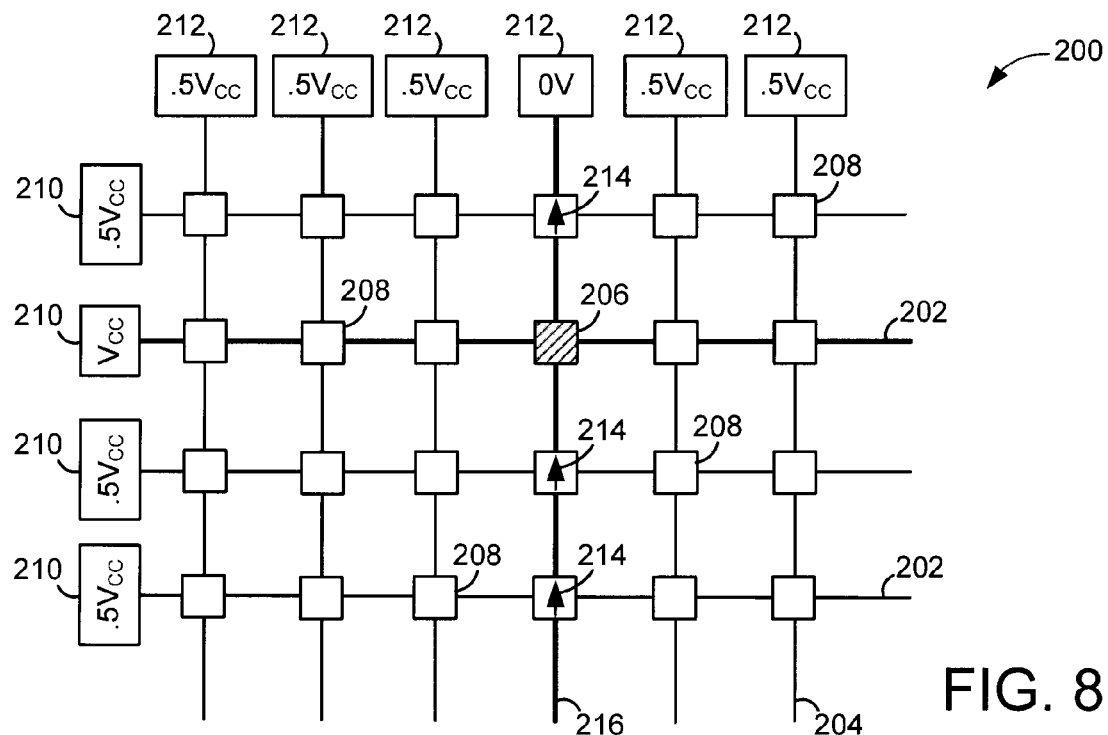
FIG. 8 provides an exemplary cross-point array of memory cells constructed and operated in accordance with various embodiments of the present invention.

FIG. 8 displays such a cross-point array of memory cells 200 constructed in accordance with various embodiments of the present invention. Such a configuration as shown in FIG. 8 provides a line driver for each respective bit and word line 202 and 204. This configuration can allow precise access to a predetermined memory cell 206 while remaining unselected memory cells 208 are not accessed.

In an exemplary operation, a bit line driver 210 and a world line driver 212 corresponding to the bit line 202 and word line 204 connected to the predetermined memory cell 206 will configure to different read voltages to allow current to pass from one line driver through the memory cell 206 to the other line driver and data to be written or read. Meanwhile, the remaining unselected memory cells 208 can be precharged with a predetermined voltage, such as 0.5 Vcc, to avoid producing noise in the bit lines 202 and word lines 204.

However, operation of a cross-point array of memory cells 200 can have disadvantages, such as the presence of unwanted current during read operations. For example, unwanted current 214 can be produced from the selected column of memory cells 216 due to the potential difference between the precharged unselected memory cells 208 and the read voltage created by the word line driver 212. As such, the higher number of memory cells connected to the selected column 216 can result in an increased probability of error when reading the predetermined memory cell 206.

Accordingly, unwanted current can be cancelled during a read operation by differentiating a first non-integrated reference value from a second non-integrated reference value. The first reference value can be determined by configuring by immediately measuring a current associated with configuring the rows and columns connected to the predetermined memory cell to a first value while passing a precharge voltage through all the rows and columns not connected to the predetermined memory cell. The second reference value can be determined by immediately measuring the current associated with configuring the row connected to the predetermined memory cell to a second value while passing the first value through the column connected to the predetermined memory cell and the precharge voltage through all the rows and columns not connected to the predetermined memory cell.

Figure 9:
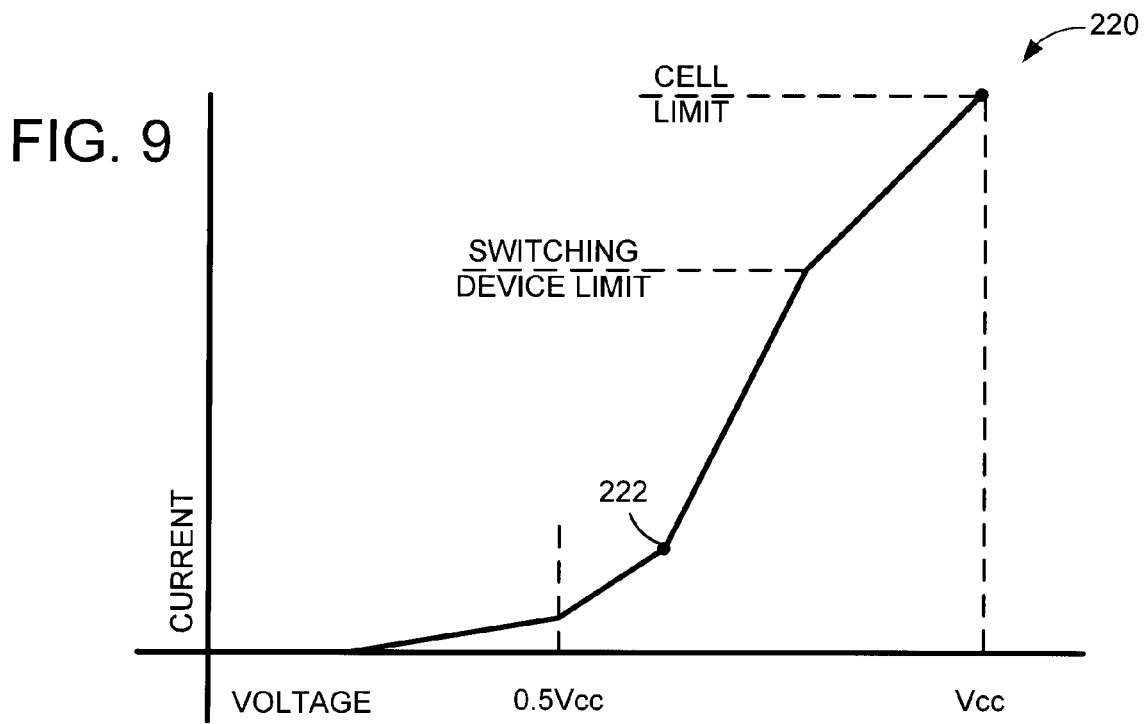
FIG. 9 graphs exemplary characteristics of a switching device operated in the cross-point array of memory cells of FIG. 7.

FIG. 9 provides a graphical illustration 220 of the characteristics of a memory cell operated in the cross-point array of memory cells shown in FIG. 8. As displayed, presence of unwanted current at point 222 creates noise that increases read difficulty. In some embodiments, the unwanted current 222 can cause the activation of a switching device, such as the switching device 188 of FIG. 7. As such, the production of unwanted current 222 provides a challenge to reliably and efficiently accessing data in a cross-point array of memory cells.

Figure 10:
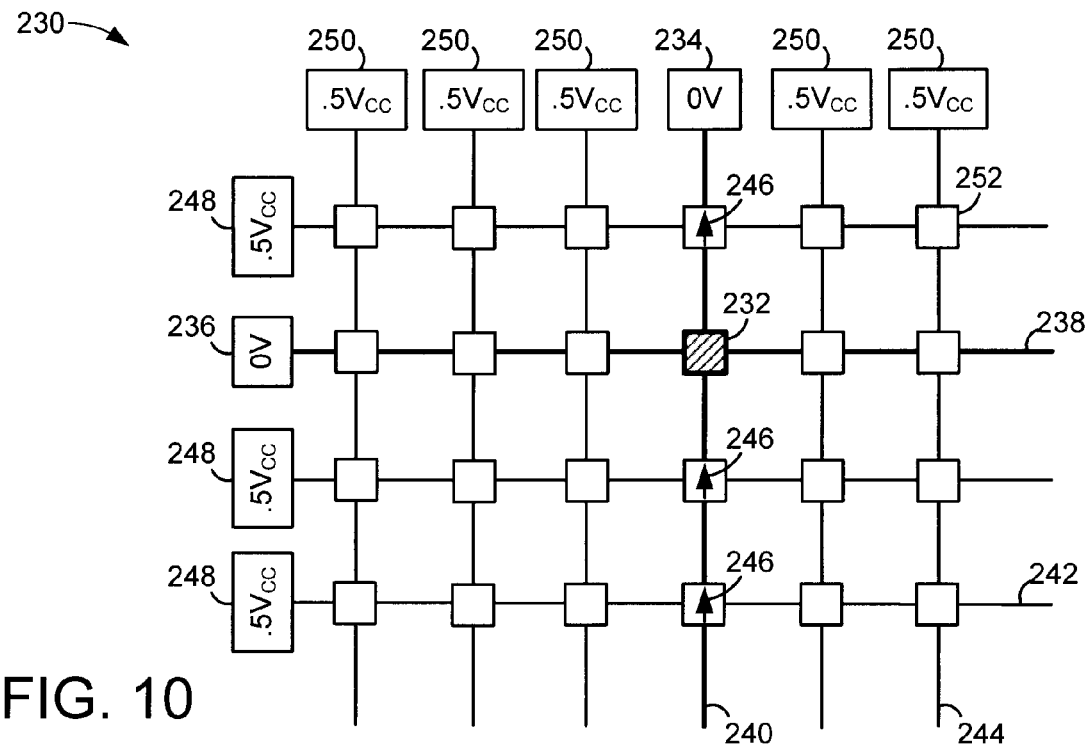
FIG. 10 shows an exemplary cross-point array of memory cells operated in accordance with various embodiments of the present invention.

An example of a cross-point array of memory cells 230 configured to determine a first reference value is illustrated in FIG. 10. A first reference value can be determined for a predetermined memory cell 232 of the cross-point array of memory cells 230 by immediately measuring a current associated with configuring the bit line driver 234 and word line driver 236 corresponding to the bit line 238 and word line 240 connected to the predetermined memory cell 232 to a first value while passing a precharge voltage through all the bit lines 242 and word lines 244 not connected to the predetermined memory cell 232. As a result, any unwanted current 246 can be aggregated into the first reference value.

In some embodiments, the first value is a substantially zero voltage, or ground, that is less than the precharge voltage. It can be appreciated that the precharge voltage passing from the unselected bit line drivers 248 and word line drivers 250 is not limited to a certain value. In various embodiments, the unselected bit and word line drivers 248 and 250 are all configured to precharge the same voltage to all the unselected memory cells 252, but such a configuration does not restrict the possible cross-point array of memory cells 230 designs.

Figure 11:
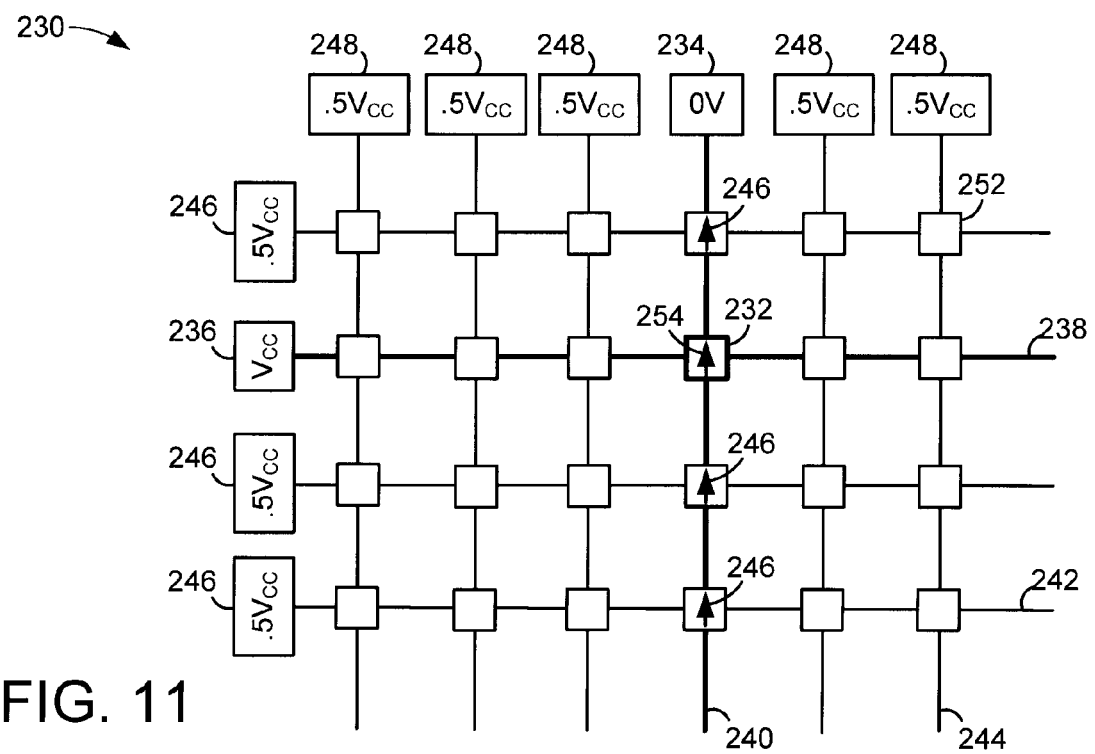
FIG. 11 illustrates an exemplary cross-point array of memory cells operated in accordance with various embodiments of the present invention.

FIG. 11 displays the cross-point array of memory cells 230 of FIG. 10 configured to determine a second reference value in accordance with various embodiments of the present invention. The second reference value can be determined, as shown, by immediately measuring the current associated with configuring the bit line driver 246 corresponding to the bit line 238 connected to the predetermined memory cell 232 to a second value while configuring the word line 240 connected to the predetermined memory cell to the first value and the precharge voltage through all the bit lines and word lines 242 and 244 not connected to the predetermined memory cell 232. Such a configuration can aggregate all unwanted currents 246 with the desired current 254 through the predetermined memory cell 232.

A differentiation of the first reference value, shown in FIG. 10, from the second reference value, shown in FIG. 11, can effectively eliminate any unwanted current 246 while keeping the desired current 254 for evaluation of logical state. Such an equation can be represented by:

$$\Delta I = \Sigma I_2 - \Sigma I_1 \quad (1)$$

where $\Sigma I_2$ equals the first reference value and $\Sigma I_1$ equals the second reference value. As such, the $\Delta I$ value can be reliably measured for a determination of the logical state of the predetermined memory cell 232 without the complication of unwanted current being incorporated into the value used to determine the logical state.

Figure 12:
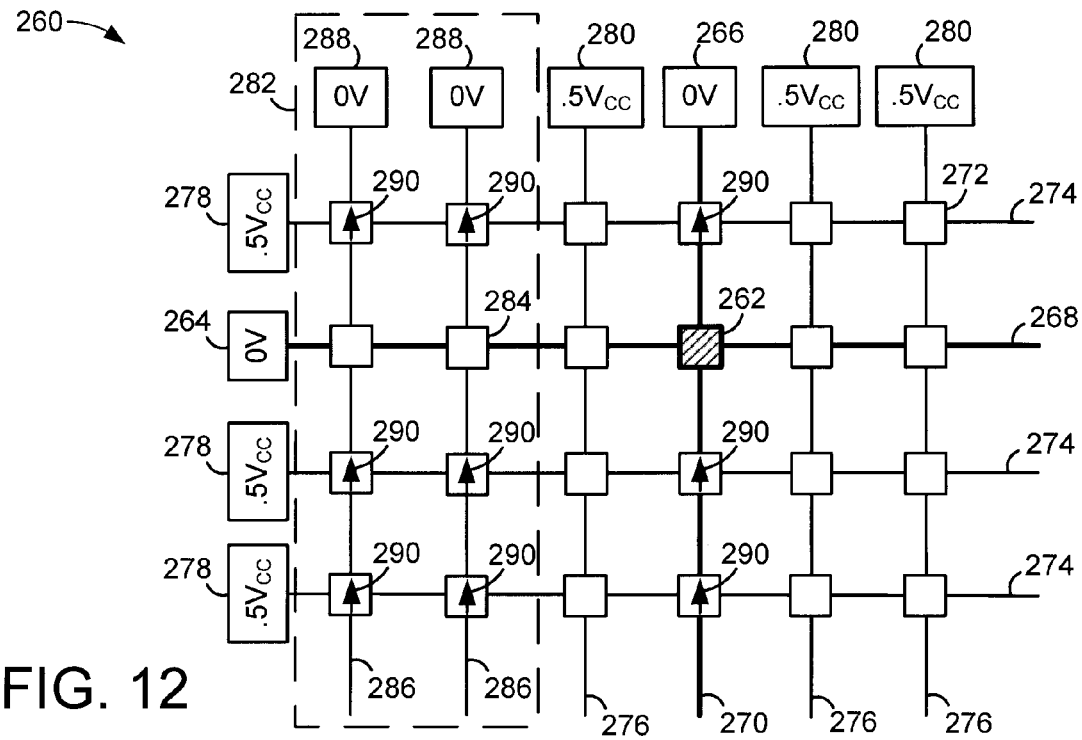
FIG. 12 displays an exemplary cross-point array of memory cells operated in accordance with various embodiments of the present invention.
Figure 13:
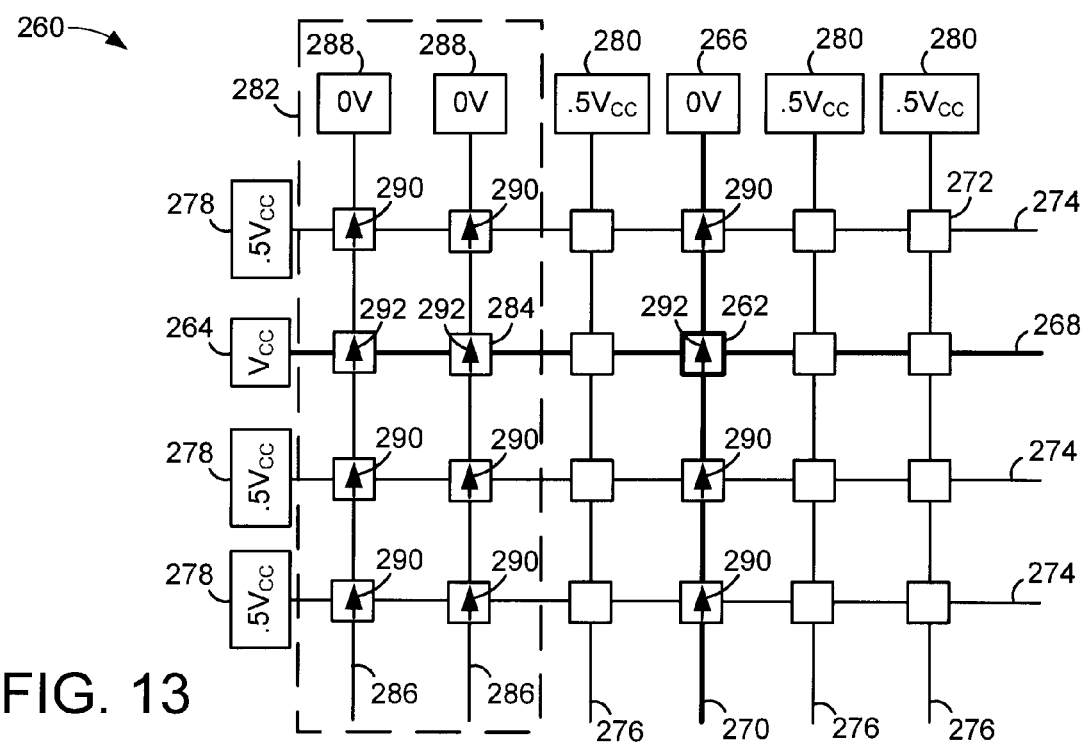
FIG. 13 displays an exemplary cross-point array of memory cells operated in accordance with various embodiments of the present invention.
Figure 14:
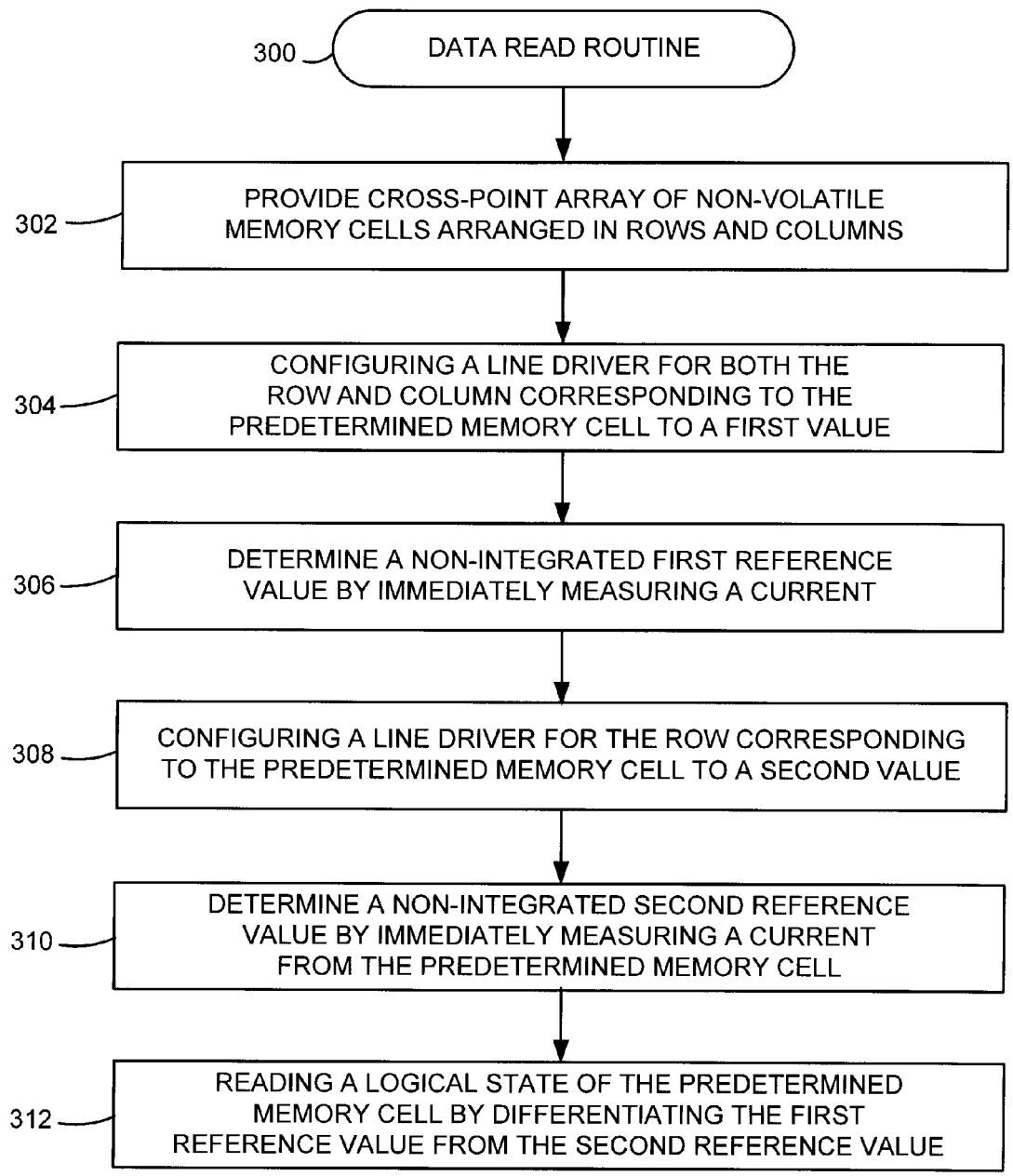
FIG. 14 displays a flowchart of a data read routine performed in accordance with various embodiments of the present invention.

In other embodiments, a cross-point array of memory cells 260 can be utilized to effectively eliminate unwanted current, as illustrated in FIGS. 12 and 13. A predetermined memory cell 262 can be read to determine a logical state by configuring a bit line driver 264 and a word line driver 266 to a first value so that a bit line 268 and word line 270 connected to the predetermined memory cell 262 receives minimal current. Meanwhile, a number of unselected memory cells 272 connected to unselected bit lines 274 and word lines 276 can also receive minimal current due to precharge voltage being produced from both unselected bit line drivers 278 and word lined drivers 280

In contrast to the cross-point array 230 of FIGS. 10 and 11, the cross-point array of memory cells 260 can provide a dummy region 282 of dummy memory cells 284 capable of supplying a first and second reference value. In operation according to various embodiments of the present invention, each dummy column of dummy memory cells connected by a dummy word line 286 is configured to the first value by dummy line drivers 288 in combination with the bit and word line drivers 264 and 266 connected to the predetermined memory cell 262. As a result, a number of unwanted currents 290 can be produced from both a plurality of dummy memory cells 284 as well as the unselected memory cells along the word line 270 connected to the predetermined memory cell 262.

In should be noted that in some embodiments, the dummy region 282 can have a column of dummy memory cells 284 set to a high resistive state while another column of dummy memory cells 284 is set to a low resistive state. As such, the resultant unwanted currents 290 can be different values for the two dummy columns due to the programmed resistances of the dummy memory cells 284.

In FIG. 13, an exemplary configuration of the cross-point array of memory cells 260 of FIG. 12 is displayed. Such a configuration can determine a second reference value with incorporation of the dummy region 282. As shown, a second reference value can be obtained by configuring the bit line driver corresponding to the bit line 268 connected to the predetermined memory cell 262 to a second value while the dummy line drivers 288 and selected bit line driver 266 are set to the first value and the unselected word line drivers 280 are configured to the precharge value.

The configuration of the cross-point array of memory cells 260 shown in FIG. 12 can produce additional unwanted currents 292 from the dummy memory cells 284 connected to the same bit line 268 as the predetermined memory cell 262. Such added unwanted currents 292 can create a difference between the first reference value and the second reference value for each column of memory cells. That is, all unwanted current from the cross-point array 260 can be eliminated through a differentiation of the first and second reference values, but the added unwanted currents 292 necessitate, in some embodiments, an additional computation.

For example, with a dummy column of memory cells set to high resistive state and another dummy column set to low resistive state, the change in measured current from each dummy column can be computed as:

$$\Delta I_H = I_{H2} - I_{H1} \quad (2)$$

where $I_{H2}$ is the current measured for the high resistive dummy column in the second reference value configuration and $I_{H1}$ is the current measure for the high resistive dummy column in the first reference configuration. Likewise, the change in measured current for the dummy column programmed to a low resistive state produces $\Delta I_L$ via equation 2 with the measured current for the first reference value configuration low resistive current being subtracted from the measured current for the second reference value configuration.

Furthermore, the dummy region 282, in combination with the $\Delta I_H$ and $\Delta I_L$ can be used to cancel all unwanted currents through the equation:

$$\Delta I_T = (I_2 - I_1) - \left[\frac{\Delta I_H + \Delta I_L}{2}\right] \quad (3)$$

where I2 is the aggregate unwanted current from the memory cells connected to the selected word line 270 for the second reference configuration, I1 is the aggregate unwanted current from the memory cells connected to the selected word line 270 for the first reference configuration, and $\Delta I_T$ is the total current for the predetermined memory cell 262 absent the canceled unwanted current.

It should be noted that the first value can be, in some embodiments, a substantially zero voltage that is less than a precharge voltage while the second value can be a value greater than that of the precharge voltage. Further in some embodiments, the first reference configuration of the cross-point array can be set so that the bit line driver 264 corresponding to the bit line 268 connected to the predetermined memory cell 262 provides the precharge voltage to the bit line 268. However, the use of such a bit line driver 264 configuration does not restrict the use of equations 2 and 3 to cancel unwanted current and measure $\Delta I_T$.

An advantage of the use of a dummy region 282 to cancel unwanted current is that data being read from the cross-point array 260 is more immune to temperature and physical location limitations that commonly add variance to data access. Additionally, the reliability and efficiency of the cross-point array 260 can be advantageously increased due to the comparison of a dummy column programmed to a high resistive state with a dummy column programmed to a low resistive state.

FIG. 13 provides a flowchart of a data read routine 300 performed in accordance with various embodiments of the present invention. The data read routine 300 initially provides a cross-point array of non-volatile memory cells arranged into columns and rows in step 302. Subsequently in step 304, a line driver for both the row and column corresponding to the predetermined memory cell is configured to a first value. In some embodiments, the column corresponding to the predetermined memory cell is configured to the first value. Further in other embodiments, the unselected rows and columns receive a precharge voltage from independent row and column line drivers during the configuration of step 304, In step 306, a non-integrated first reference value is determined by measuring a current immediately after the configuration of line drivers in step 304. While the first reference value can be obtained as the aggregate of the currents present for the column of memory cells corresponding to the predetermined memory cell, a dummy region of memory cells can also be utilized, as discussed above. Subsequently, the line driver for the row corresponding to the predetermined memory cell is configured to a second value in step 308.

Immediately upon configuration of the line driver in step 308, a non-integrated second reference value is determined by measuring a current from the predetermined memory cell at step 310. It can be appreciated that the non-integration limitation of the first and second reference values restricts the determination of the reference values to mathematical computation other than integration, such as aggregation and subtraction. Furthermore, the non-integration limitation can be interpreted to restrict the use of a time component in the computation of the first and second reference values.

Finally in step 312, a logical state of the predetermined memory cell is read by differentiating the first reference value from the second reference value. Such differentiation can be accomplished, in some embodiments, with the use of an average current measured from a dummy region having a high resistive column and a low resistive column.

As can be appreciated by one skilled in the art, the various embodiments illustrated herein provide advantageous reading of data from memory cell in an efficient manner. The cancellation of unwanted current during a read operation allows for scaleable memory arrays that can be quickly and reliably read. With unwanted current being cancelled regardless of the size of the cross-point array, common problems such as process defects, temperature variations, and line resistance can be significantly reduced to produce a more reliable logical state evaluation of a memory cell. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising: a cross-point array of non-volatile memory cells arranged into rows and columns and each controlled by a line driver, and a read circuit capable of reading a logical state of a predetermined memory cell by differentiating a non-integrated first reference value from a non-integrated second reference value, wherein each reference value is measured immediately after configuring the column corresponding to the predetermined memory cell to produce a first and second amount of current while passing a precharge voltage through all the rows and columns not connected to the predetermined memory cell.

2. The apparatus of claim 1, wherein the first reference value is determined by immediately measuring the first amount of current associated with configuring the rows and columns connected to the predetermined memory cell to a first value.

3. The apparatus of claim 1, wherein the second reference value is determined by immediately measuring the second amount of current associated with configuring the row connected to the predetermined memory cell to a second value that is different than the first value while passing the first value through the column connected to the predetermined memory cell.

4. The apparatus of claim 1, wherein the memory cells are characterized as spin torque random access memory (STRAM) cells.

5. The apparatus of claim 1, wherein the memory cells are characterized as resistive random access memory (RRAM) cells.

6. The apparatus of claim 1, wherein the first value corresponds to a voltage lower than the precharge voltage.

7. The apparatus of claim 1, wherein the second value corresponds to a voltage greater than the precharge voltage.

8. The apparatus of claim 1, wherein a different precharge voltage is applied to first and second columns, respectively.

9. The apparatus of claim 1, wherein the first reference value is the aggregate of a plurality of unwanted currents from the column of the predetermined memory cell.

10. The apparatus of claim 9, wherein the second reference value is the aggregate of the plurality of unwanted currents and a desired current.

11. The apparatus of claim 10, wherein the unwanted current is large enough to activate a switching device connected to a memory cell of the column of the predetermined memory cell.

12. The method of claim 11, wherein the first value corresponds to a voltage lower than the precharge voltage.

13. The method of claim 11, wherein the second value corresponds to a voltage greater than the precharge voltage.

14. The method of claim 11, wherein the array of memory cells has a first common number of memory cells in each column and a second common number of memory cells in each row, the first common number being greater than the second common number.

15. The method of claim 11, wherein the precharge voltage is ½ a writing voltage that corresponds to an upper limit of the memory cells.

16. The method of claim 11, wherein the precharge voltage varies between first and second unselected columns.

17. The method of claim 11, wherein the first reference value is measured for multiple columns of memory cells concurrently.

18. A method comprising: providing a cross-point array of non-volatile memory cells arranged into rows and columns and each controlled by a line driver, and reading a logical state of a predetermined memory cell with a read circuit by differentiating a non-integrated first reference value from a non-integrated second reference value, wherein each reference value is measured immediately after configuring the column corresponding to the predetermined memory cell to produce a first and second amount of current while passing a precharge voltage through all the rows and columns not connected to the predetermined memory cell.

19. The method of claim 18, wherein the first reference value is determined by immediately measuring the first amount of current associated with configuring the rows and columns connected to the predetermined memory cell to a first value.

20. The method of claim 18, wherein the second reference value, determined by immediately measuring the second amount of current associated with configuring the row connected to the predetermined memory cell to a second value that is different than the first value while passing the first value through the column connected to the predetermined memory cell.

* * * * *